United States Patent
Rubio Guivernau et al.

(10) Patent No.: US 11,402,579 B2
(45) Date of Patent: Aug. 2, 2022

(54) TECHNIQUES FOR FABRICATING WAVEGUIDE FACETS AND DIE SEPARATION

(71) Applicant: Medlumics S.L., Madrid (ES)

(72) Inventors: José Luis Rubio Guivernau, Madrid (ES); Eduardo Margallo Balbás, Madrid (ES)

(73) Assignee: Medlumics S.L., Madrid (ES)

( * ) Notice: Subject to any disclaimer, the term of this patent is extended or adjusted under 35 U.S.C. 154(b) by 0 days.

(21) Appl. No.: 16/222,263

(22) Filed: Dec. 17, 2018

(65) Prior Publication Data

US 2019/0196102 A1  Jun. 27, 2019

Related U.S. Application Data

(60) Provisional application No. 62/610,713, filed on Dec. 27, 2017.

(51) Int. Cl.
*G02B 6/00* (2006.01)
*G02B 6/136* (2006.01)
(Continued)

(52) U.S. Cl.
CPC .......... *G02B 6/136* (2013.01); *B81C 1/00904* (2013.01); *B81C 1/00896* (2013.01);
(Continued)

(58) Field of Classification Search
CPC .......... G02B 6/136; G02B 2006/12176; B81C 1/00904
See application file for complete search history.

(56) References Cited

U.S. PATENT DOCUMENTS

| | | | |
|---|---|---|---|
| 6,881,610 B2* | 4/2005 | Headley | G02B 6/4207 257/E21.599 |
| 2002/0013061 A1 | 1/2002 | Siniaguine et al. | |

(Continued)

FOREIGN PATENT DOCUMENTS

JP    H06 5701 A    1/1994

OTHER PUBLICATIONS

International Search Report and Written Opinion directed to related International Patent Application No. PCT/EP2018/086364, dated Apr. 8, 2019; 13 pages.

(Continued)

*Primary Examiner* — Mounir S Amer
*Assistant Examiner* — Alexander Belousov
(74) *Attorney, Agent, or Firm* — Sterne, Kessler, Goldstein & Fox P.L.L.C.

(57) ABSTRACT

A fabrication method includes arranging a plurality of dice on a substrate and performing a first etching process that etches a first layer of the substrate at a boundary between adjacent dice on the substrate. The etching forms facets of one or more waveguides that are defined within the first layer, and the etching leaves a portion of the first layer in the boundary between the adjacent dice. The method continues with a second etching process that etches the portion of the first layer and a second layer beneath the portion of the first layer, the second etching process forming a trench in the boundary where the second layer has a different material than the first layer. The method also includes separating the dice from one another along the trench.

8 Claims, 14 Drawing Sheets

(51) Int. Cl.
   *B81C 1/00* (2006.01)
   *G02B 6/12* (2006.01)
(52) U.S. Cl.
   CPC .............. *G02B 2006/12061* (2013.01); *G02B 2006/12069* (2013.01); *G02B 2006/12176* (2013.01)

(56) References Cited

U.S. PATENT DOCUMENTS

| | | |
|---|---|---|
| 2002/0114571 A1 | 8/2002 | Lin et al. |
| 2003/0100143 A1 | 5/2003 | Mulligan et al. |
| 2004/0130001 A1 | 7/2004 | Headley et al. |
| 2006/0065953 A1* | 3/2006 | Kim .................... H01L 23/3192 257/620 |
| 2007/0173032 A1 | 7/2007 | Gibson et al. |
| 2008/0227234 A1* | 9/2008 | Yoshino .............. B81C 1/00873 438/51 |
| 2013/0084661 A1* | 4/2013 | Yasuda ............... H01L 21/6836 438/15 |

OTHER PUBLICATIONS

International Preliminary Report on Patentability directed to related International Patent Application No. PCT/EP2018/086364, dated Jun. 30, 2020; 9 pages.

\* cited by examiner

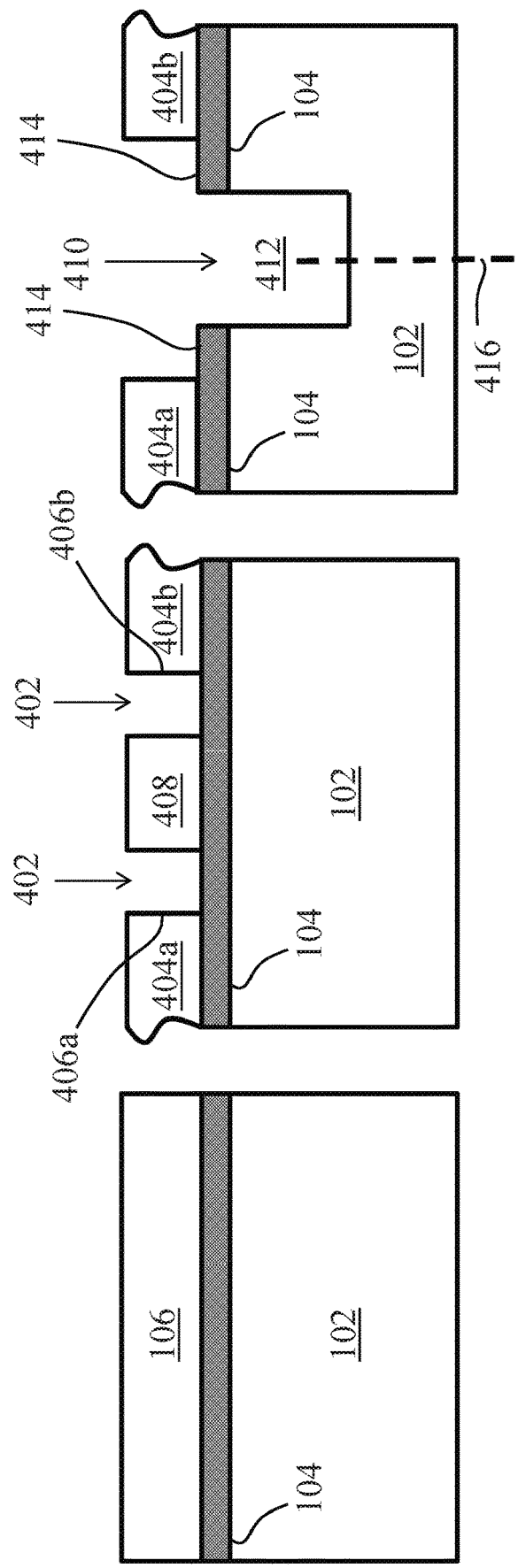

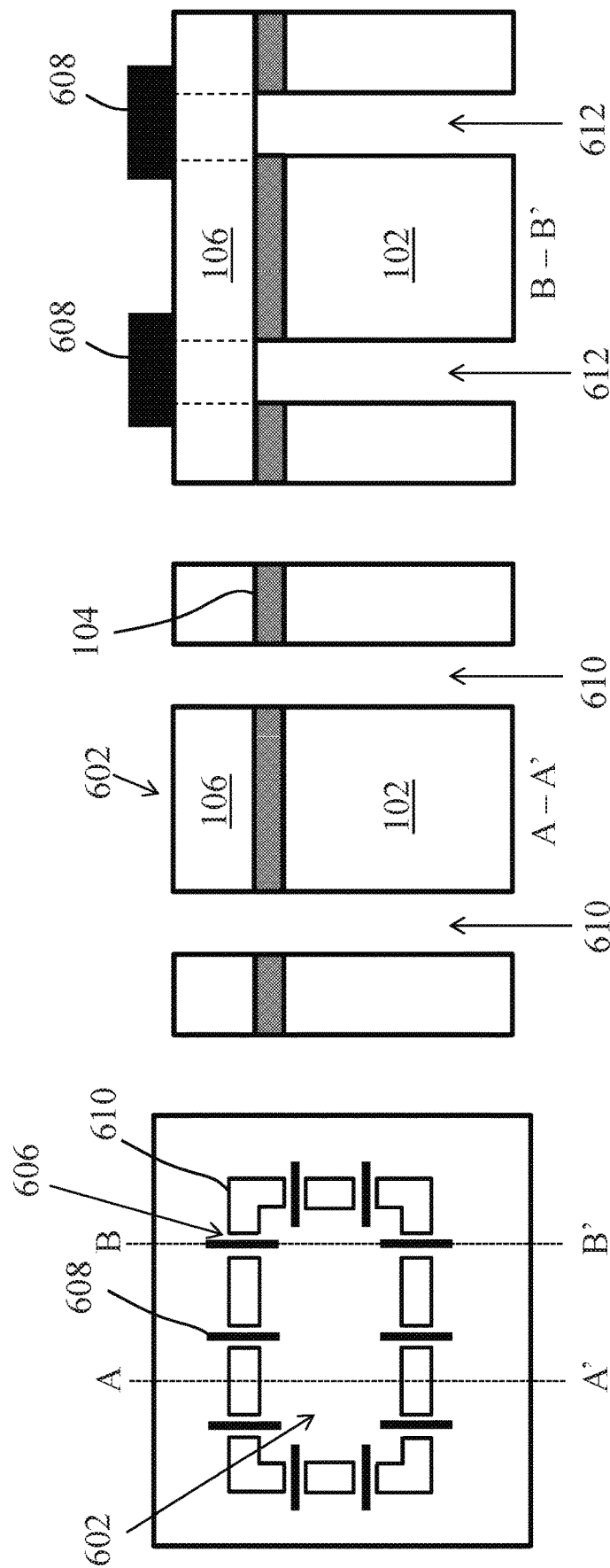

TECHNIQUES FOR FABRICATING WAVEGUIDE FACETS AND DIE SEPARATION

CROSS-REFERENCE TO RELATED APPLICATIONS

This application claims the benefit of U.S. Provisional Patent Application No. 62/610,713, filed Dec. 27, 2017, entitled "Techniques for Fabricating Waveguide Facets and Die Separation," the entirety of which is hereby incorporated by reference.

TECHNICAL FIELD

Embodiments of the invention relate to fabrication techniques for defining semiconductor waveguides and for die separation.

BACKGROUND

Semiconductor waveguides are used in numerous applications that use any type of integrated optical circuit. The fields of telecommunications and medical device design use optical waveguides to carry data and/or imaging information. The waveguides are typically fabricated according to strict standards to reduce any leakage and maximize coupling of light into and out of the waveguide facets. It is thus desirable to achieve as low a roughness as possible on the facets, which can depend on the etching process used to define the waveguides, and the process used to separate dice from one another on the wafer.

BRIEF SUMMARY

In the embodiments presented herein, various fabrication methods for producing waveguide facets and separating dice are presented.

In an embodiment, a method includes arranging a plurality of dice on a substrate and performing a first etching process that etches a first layer of the substrate at a boundary between adjacent dice on the substrate. The etching forms facets of one or more waveguides that are defined within the first layer, and the etching leaves a portion of the first layer in the boundary between the adjacent dice. The method continues with a second etching process that etches the portion of the first layer and a second layer beneath the portion of the first layer, the second etching process forming a trench in the boundary where the second layer has a different material than the first layer. The method also includes separating the dice from one another along the trench.

In another embodiment, a method includes arranging a plurality of dice on a substrate and performing a first etching process that etches a first layer of the substrate at a boundary between adjacent dice on the substrate. The etching forms facets of one or more waveguides that are defined within the first layer. The method continues with a second etching process that etches a second layer beneath the portion of the first layer, the second etching process forming a trench in the boundary where the second layer has a different material than the first layer. The method also includes separating the dice from one another along a region that is displaced from the trench.

In another embodiment, a method includes arranging a plurality of dice on a substrate and performing a first etching process that etches a first layer of the substrate at a boundary between adjacent dice on the substrate. The etching forms facets of one or more waveguides that are defined within the first layer, and the etching leaves bridge portions of the first layer in the boundary between the adjacent dice. The method includes patterning strips of a polymer material over the bridge portions of the first layer in the boundary. The method includes performing a second etching process that etches through a thickness of a bulk portion of the substrate beneath the second layer, and through a thickness of the second layer such that the dice are connected to the remainder of the substrate only via the bridge portions and the strips of polymer material. The method also includes separating the dice from one another along the boundary.

BRIEF DESCRIPTION OF THE DRAWINGS/FIGURES

The accompanying drawings, which are incorporated herein and form a part of the specification, illustrate embodiments of the present invention and, together with the description, further serve to explain the principles of the invention and to enable a person skilled in the pertinent art to make and use the invention.

FIGS. 4A-4C illustrate steps of a first fabrication procedure for a plurality of dice, according to an embodiment.

FIGS. 8A-8C illustrate different views of another step of the third fabrication procedure for a plurality of dice, according to an embodiment.

Figure 1:
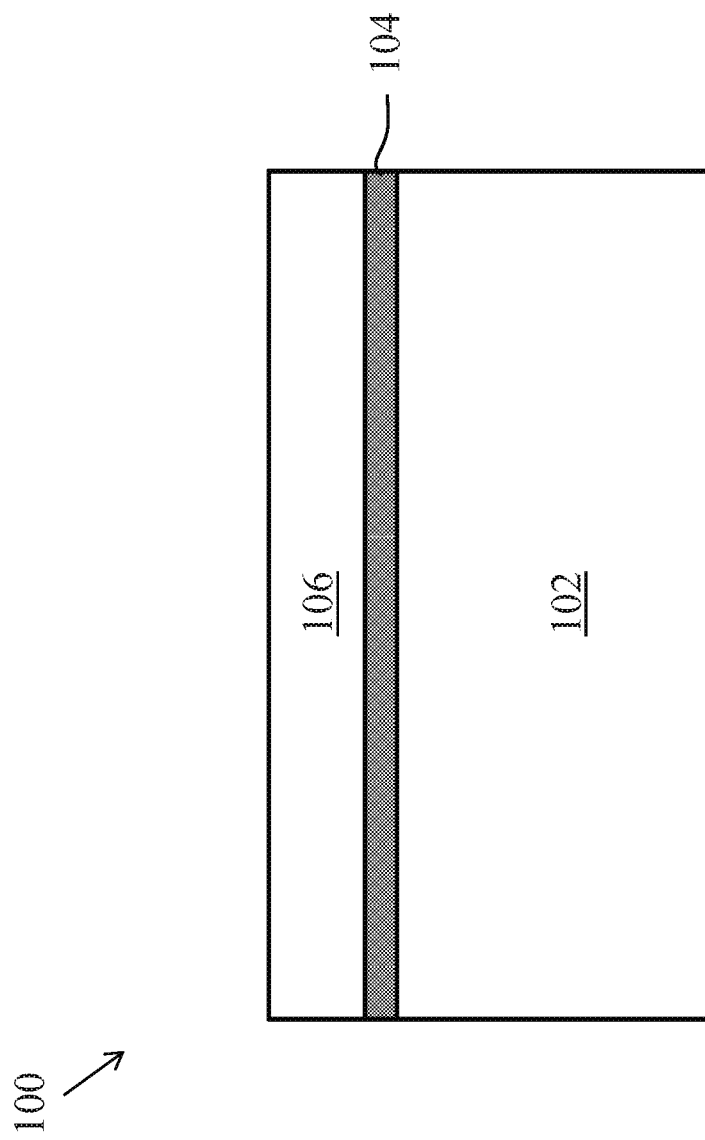
FIG. 1 illustrates a silicon-on-insulator substrate.

Embodiments of the present invention will be described with reference to the accompanying drawings. It is to be understood that the drawings are not drawn to scale and any specific geometric shapes or dimensions used in the drawings are used only to provide example embodiments of the invention.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention may also be employed in a variety of applications and is not limited to any one particular application.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

Embodiments herein relate to various fabrication procedures for defining waveguide facets and also for separating dice on a wafer so as to not damage the waveguide facets. Maintaining a mirror-smooth quality to waveguide facets is important to preserve a high coupling efficiency of light and to reduce scattering of light entering and exiting the facets. Before describing each of the fabrication procedures, some background description of waveguide patterning on an array of optical integrated circuits will be provided.

FIG. 1 illustrates an example of a silicon-on-insulator (SOI) substrate 100. SOI substrates are designed to have a bulk portion (102), also known as a handle layer, and a buried silicon oxide layer 104 between bulk portion 102 and a top active layer 106. Both top active layer 106 and bulk portion 102 are silicon. Top active layer 106 may have a thickness between about 3 µm and 10 µm, while buried silicon oxide layer 104 may have a thickness between about 300 nm and 3 µm. In another example, top active layer 106 has a thickness between about 1 µm and 3 µm or between about 100 nm and 1 µm. A thickness of the entire SOI substrate 100 is typically between about 250 µm and 700 µm.

Top active layer 106 may be etched to provide various structures, such as waveguides. The etching of top active layer 106 may be performed such that the process etches the silicon of top active layer 106, but substantially does not etch buried silicon oxide layer 104. Buried silicon oxide layer 104 also provides electrical and thermal isolation between top active layer 106 and bulk portion 102. Additionally, buried silicon oxide layer 104 has a lower refractive index than the silicon of top active layer 106, thus acting as a cladding layer for waveguides patterned in top active layer 106.

Figure 2B:
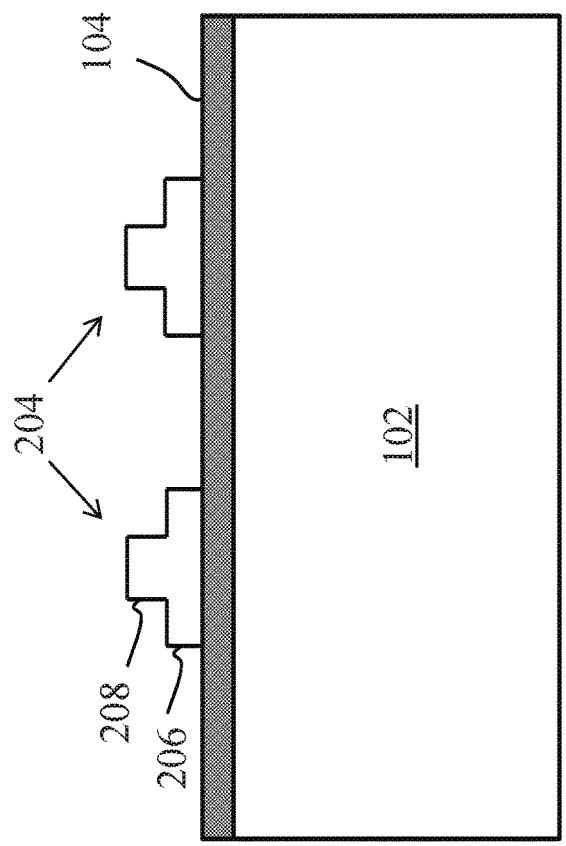
FIG. 2B illustrates an example of rib waveguides patterned on a silicon-on-insulator substrate.
Figure 2A:
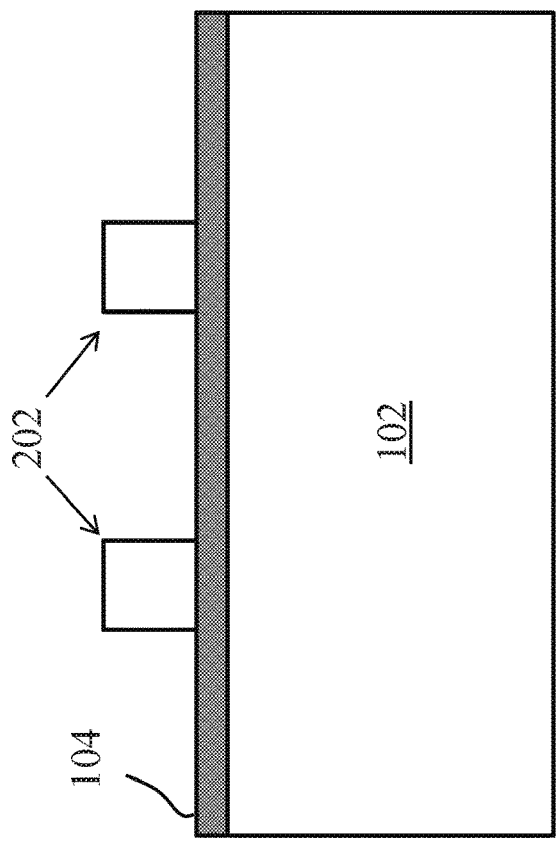
FIG. 2A illustrates an example of strip waveguides patterned on a silicon-on-insulator substrate.

FIGS. 2A and 2B provide examples of different types of waveguides patterned in top active layer 106. The illustrations are cross-sections taken across a width of the waveguides such that the waveguides run lengthwise over buried silicon oxide layer 104 in a direction normal to the page.

FIG. 2A illustrates strip waveguides 202 patterned above buried silicon oxide layer 104. Strip waveguides 202 may be patterned using a single etching process to etch through a thickness of top active layer 106. FIG. 2B illustrates rib waveguides 204 patterned above buried silicon oxide layer 104. Rib waveguides 204 are formed using at least two etch processes that create a base portion 206 and a rib portion 208 for each rib waveguide 204. Base portion 206 may have a thickness around 1.8 µm, for example, while rib portion 208 may have a thickness of around 1.2 µm, for example, that extends above base portion 206. In another example, base portion 206 has a thickness that is about 60% of the total thickness of each rib waveguide 204, while rib portion 208 has a thickness that is about 40% of the total thickness of each rib waveguide 204. In other examples, a ratio of the thickness of base portion 206 to the thickness of rib portion 208 is 1:1, 1.5:1, 2:1, 2.5:1, or 3:1. Although not illustrated, a cladding layer may be provided over the top and side surfaces of both strip waveguides 202 and rib waveguides 204 to provide a matching index material with buried silicon oxide layer 104. As such, the cladding layer is typically silicon dioxide or silicon nitride, though other dielectric materials may be used as well.

Figure 3:
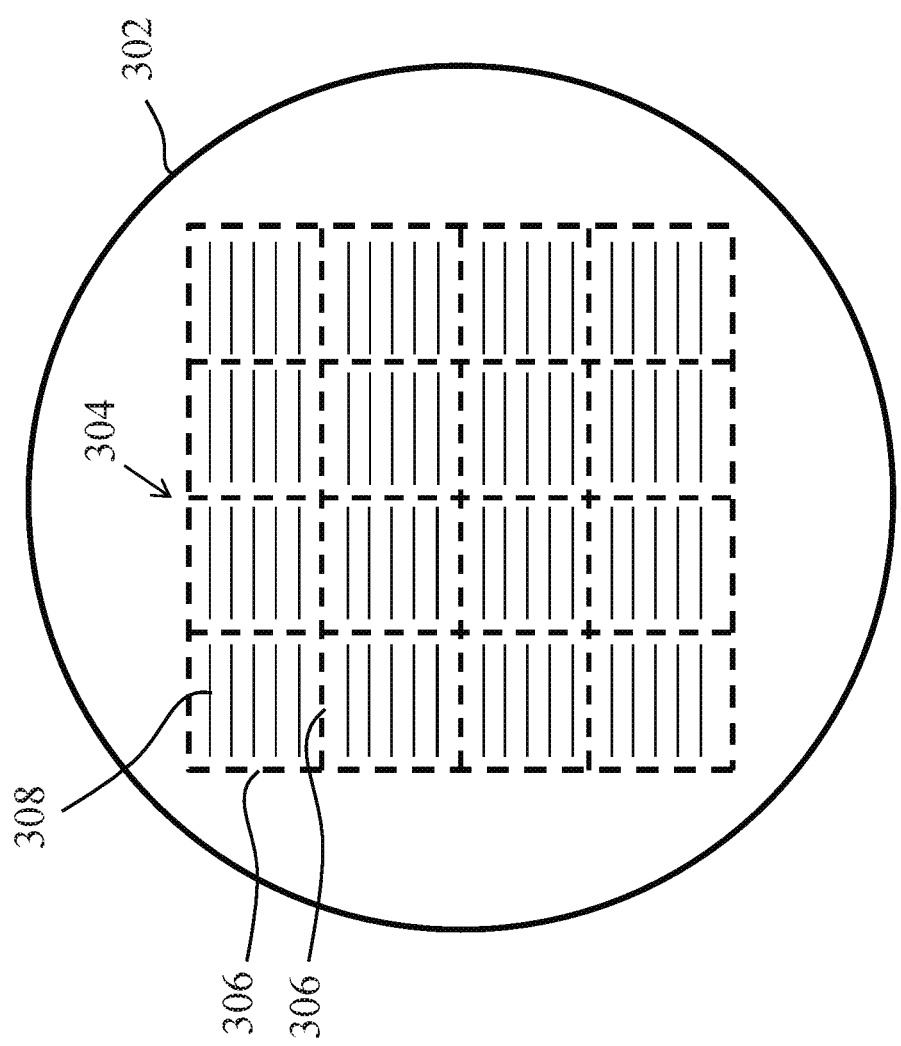
FIG. 3 illustrates an example of dice patterned on a wafer, according to an embodiment.

FIG. 3 illustrates a top-down view of a substrate 302 having a plurality of dice 304 arranged on it. The use of the term "arranged" in this context means that the dice are defined on substrate 302 in some pattern, such as a two-dimensional array. Plurality of dice 304 may be separated by boundary lines 306. Boundary lines 306 may represent imaginary lines across substrate 302 where a dicing saw or a laser cutting device will be used to separate plurality of dice 304 from one another. In another example, an etched or patterned feature may be used to define boundary lines 306. Boundary lines 306 are also sometimes known as scribe lanes. Depending on the crystal orientation of the bulk portion of substrate 302, it may also be possible to cleave substrate 302 along boundary lines 306 to separate plurality of dice 304 from one another.

According to an embodiment, each die of plurality of dice 304 includes a plurality of waveguides 308, in any desired arrangement on each die 304. Plurality of waveguides 308 may be strip waveguides, rib waveguides, or a combination of the two. Plurality of waveguides 308 may have facets at or near boundary lines 306. As such, a single die from plurality of dice 304 may have waveguide facets located along one or more edges of the die.

FIGS. 4A-4C illustrate steps of a first fabrication procedure to form waveguide facets near the edges of adjacent dice, according to an embodiment. As such, FIGS. 4A-4C illustrate processes that occur at or near boundary lines 306 between adjacent dice. The various layers that are illustrated are not drawn to scale. Additionally, some fabrication steps known to persons of skill in the art have been omitted for clarity. For example, the steps of depositing and patterning photoresist to mask the surface of the substrate before performing the etches have been omitted, but would be understood to occur by a person skilled in the art.

FIG. 4A illustrates a starting SOI substrate having the same bulk portion 102, buried silicon oxide layer 104, and top active layer 106 as discussed above with reference to FIG. 1. FIG. 4B illustrates a first etching process having an etch 402 through a thickness of top active layer 106 down to buried silicon oxide layer 104. Etch 402 may be performed using a reactive ion etch (RIE) process that has a high etch rate for silicon and a substantially lower etch rate for silicon oxide. An anisotropic wet etch may also be performed depending on the crystal orientation of the silicon in top active layer 106. An example wet etchant is potassium hydroxide (KOH) or tetramethylammonium hydroxide (TMAH).

In one example, etch 402 may be the same etch that defines waveguides 404a and 404b on different dice. Etch 402 may represent a single etch step that also defines waveguides 404a and 404b, such as when waveguides 404a and 404b are strip waveguides. In another example, etch 402 may represent two different etch steps that also define waveguides 404a and 404b, such as when waveguides 404a and 404b are rib waveguides. FIG. 4B illustrates a cross-section taken along a length of waveguides 404a and 404b, and as such, waveguides 404a and 404b have facets 406a and 406b, respectively, defined by etch 402. Etch 402 may be aligned such that a distance between facet 406a and facet 406b is between about 70 μm and about 200 μm. The wavy lines at the edges of waveguides 404a and 404b signify that the waveguides extend further along the wafer to the left and the right, respectively.

According to an embodiment, etch 402 leaves a portion 408 of top active layer 106 within a boundary region between the adjacent dice. Portion 408 may represent a strip of top active layer 106 that runs over each boundary line 306, as illustrated in FIG. 3. A width of portion 408 may vary between about 20 μm and 50 μm.

FIG. 4C illustrates a next step of the fabrication process where another etching process has an etch 410 that defines a trench 412 separating adjacent dice from one another, according to an embodiment. Trench 412 may have a depth within bulk portion 102 of between about 50 μm and about 150 μm. Etch 410 forms a shelf 414 that extends about 1 μm to 5 μm between a given facet 406a/406b and an edge of trench 412, according to an embodiment. Shelf 414 is ideally made as small as possible to maximize edge coupling of light into and out of facets 406a and 406b. As such, trench 412 may have a width between about 60 μm and 198 μm.

Due to the alignment of trench 412, etch 410 also etches through portion 408 of top active layer 106, according to an embodiment. Thus, a different etch is used to define facets 406a and 406b from the etch used to define trench 412. A deep reactive ion etch (DRIE) process may be used to etch through a thickness of portion 408, a thickness of buried silicon oxide layer 104, and into bulk portion 102. The DRIE process may use more than one etch recipe to etch through the various layers if, for example, the layers are different materials. The dice may be separated from one another along trench 412 using, for example, a dicing saw or a laser cutting device to cut along plane 416. Plane 416 may be substantially similar to boundary lines 306 illustrated in FIG. 3. According to an embodiment, by leaving portion 408 behind, etch 402 does not etch any portion of the top active layer 106 overlying where the separation occurs.

FIGS. 5A-5E illustrate steps of a second fabrication procedure to form waveguide facets near the edges of adjacent dice, according to an embodiment. As such, FIGS. 5A-5E illustrate processes that occur at or near boundary lines 306 between adjacent dice. As discussed above, the various layers that are illustrated are not drawn to scale, and some known fabrication steps have been omitted for clarity.

Figures 5A, 5B, 5C:
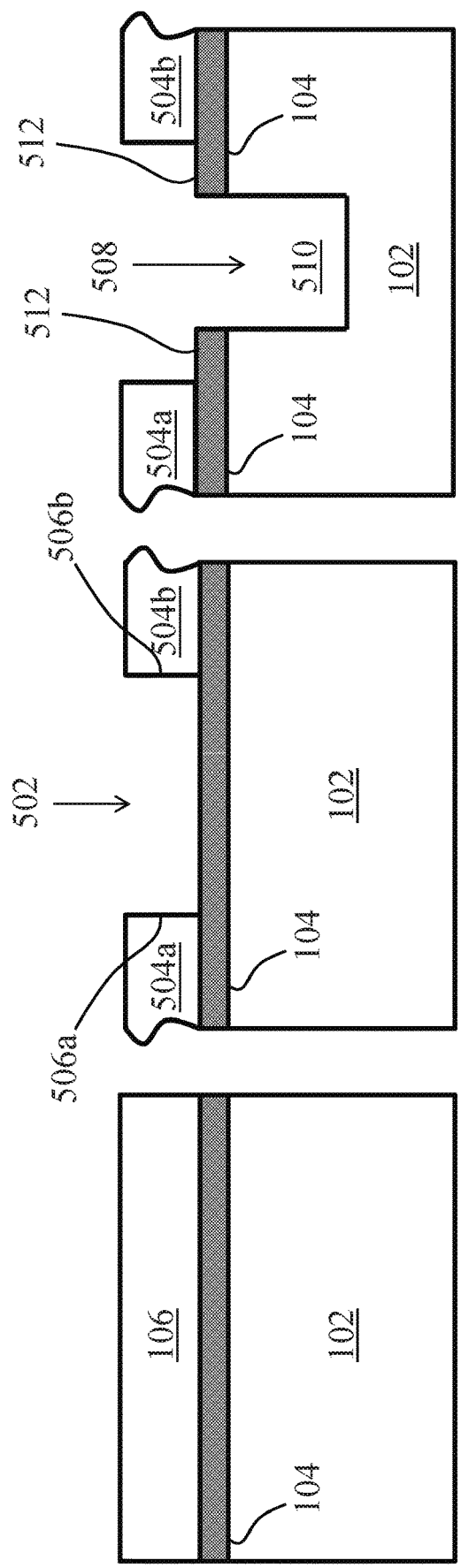
FIGS. 5A-5E illustrate steps of a second fabrication procedure for a plurality of dice, according to an embodiment.

FIG. 5A illustrates a starting SOI substrate having the same bulk portion 102, buried silicon oxide layer 104, and top active layer 106 as discussed above with reference to FIG. 1. FIG. 5B illustrates a first etching process having an etch 502 through a thickness of top active layer 106 down to buried silicon oxide layer 104. Etch 502 may be performed using a reactive ion etch (RIE) process that has a high etch rate for silicon and a substantially lower etch rate for silicon oxide. An anisotropic wet etch may also be performed depending on the crystal orientation of the silicon in top active layer 106. Example wet etchants are KOH and TMAH.

In one example, etch 502 may be the same etch that defines waveguides 504a and 504b on different dice. Etch 502 may represent a single etch step that also defines waveguides 504a and 504b, such as when waveguides 504a and 504b are strip waveguides. In another example, etch 502 may represent two different etch steps that also define waveguides 504a and 504b, such as when waveguides 504a and 504b are rib waveguides. FIG. 5B illustrates a cross-section taken along a length of waveguides 504a and 504b, and as such, waveguides 504a and 504b have facets 506a and 506b, respectively, defined by etch 502. Etch 502 may be aligned such that a distance between facet 506a and facet 506b is between about 70 μm and 200 μm.

FIG. 5C illustrates a next step of the fabrication process where a second etching process has an etch 508 that defines a trench 510 separating adjacent dice from one another, according to an embodiment. Trench 510 may have a depth within bulk portion 102 of between 50 μm and 150 μm. Etch 508 forms a shelf 512 that extends about 1 μm to 5 μm between a given facet 506a/506b and an edge of trench 510, according to an embodiment. Shelf 512 is ideally made as small as possible to maximize edge coupling of light into and out of facets 506a and 506b. As such, trench 510 may have a width between about 60 μm and 198 μm. A deep reactive ion etch (DRIE) process may be used to etch through a thickness of buried silicon oxide layer 104 and into bulk portion 102. The DRIE process may use different etch recipes to etch through buried silicon oxide layer 104 and bulk portion 102.

Figure 5D:
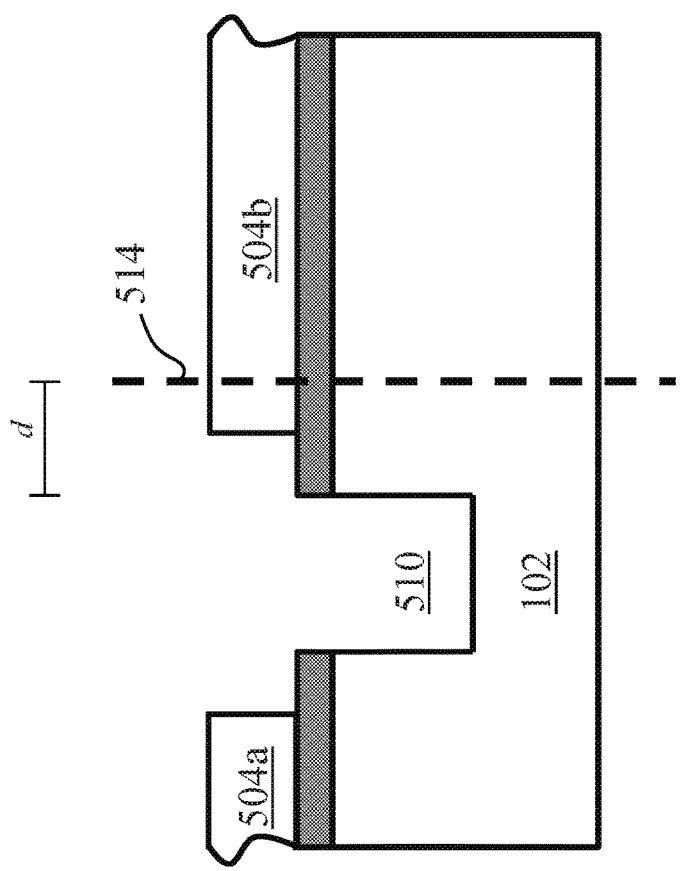

FIG. 5D illustrates the same structure illustrated in FIG. 5C, but shows more of waveguide 504b to better indicate a dicing lane 514, according to an embodiment. The dice are separated from one another via dicing along dicing lane 514. Dicing lane 514 may have a distance d from an edge of trench 510 that is at least 20 μm or at least 50 μm. Thus, the separation of the dice does not occur at the region defined by etch 502, or the region defined by etch 508.

Figure 5E:
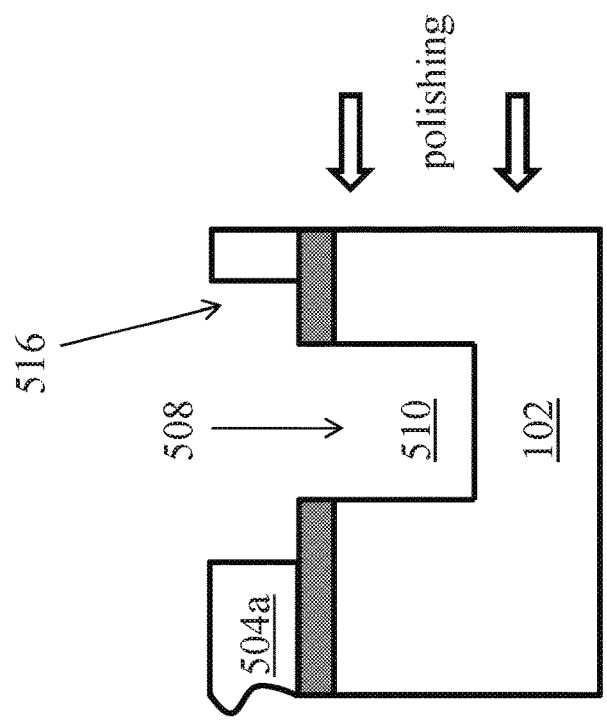

FIG. 5E illustrates a single die after it has been removed via dicing along dicing lane 514, according to an embodiment. The dicing process leaves behind an unwanted region 516 at the edge of the die that can be removed via a polishing process performed along the side of the die, according to an embodiment. A chemical mechanical polish (CMP) technique may be used to polish the side of the die, the process of which would be understood by a person skilled in the art. The side of the die may be polished back until the entire unwanted region 516 is removed (i.e., until the edge of the die lies somewhere in, or along the sidewalls of, trench 510, for example, until trench 510 is reached by the polishing.) Alternatively, the side of the die may be polished back until the edge of bulk portion 102 is even with facet 506a of waveguide 504a.

Figure 6C:
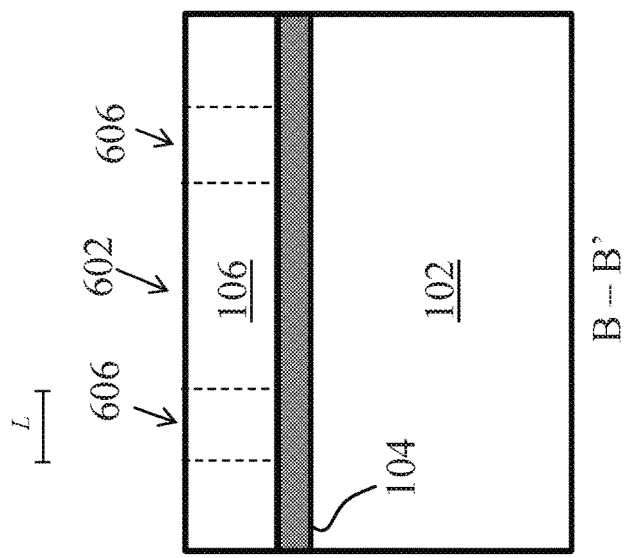
FIGS. 6A-6C illustrate different views of a step of a third fabrication procedure for a plurality of dice, according to an embodiment.
Figure 6B:
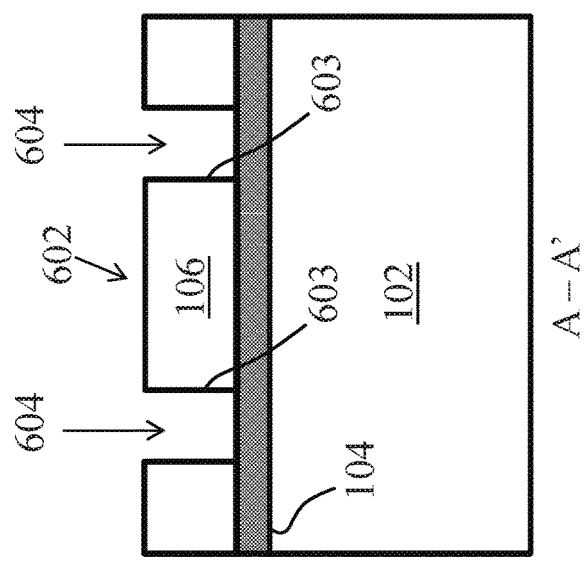
Figure 6A:
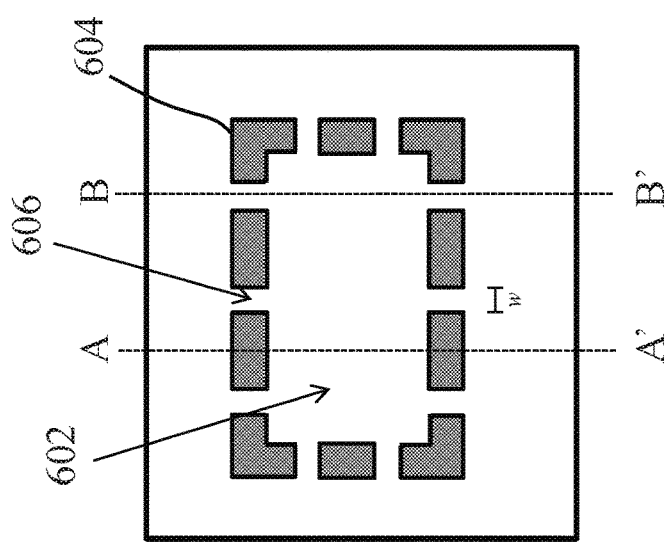

FIGS. 6A-6C illustrate three views of a first step of a third fabrication process, according to an embodiment. FIG. 6A provides a top-down view of the substrate. FIG. 6B provides a cross-section view along the A-A' line while FIG. 6C provides a cross-section view along the B-B' line.

FIG. 6A and FIG. 6B illustrate a die region 602 defined by a first etching process having an etch 604 through a thickness of top active layer 106 down to buried silicon oxide layer 104, according to an embodiment. Etch 604 may be performed using a reactive ion etch (RIE) process that has a high etch rate for silicon and a substantially lower etch rate for silicon oxide. An anisotropic wet etch may also be performed depending on the crystal orientation of the silicon in top active layer 106. Example wet etchants include KOH and TMAH. It should be understood that only a single die is illustrated in the top-down view of FIG. 6A, and that a plurality of dice would be arranged across bulk portion 102. Each of the plurality of dice may be fabricated and removed from bulk portion 102 using the same process described for die region 602.

Etch 604 may be the same etch that defines waveguides on die region 602. The waveguides are not illustrated on die region 602 in the top-down view of FIG. 6A for clarity. In one example, etch 604 may represent a single etch step that also defines strip waveguides. In another example, etch 604 may represent two different etch steps that also defines rib waveguides. Etch 604 may also define facets 603 of either waveguide type along the edges of die region 602.

Etch 604 is patterned such that it substantially encloses die region 602, except for bridge portions 606 as seen in FIG. 6A, according to an embodiment. As such, bridge portions 606 are defined by etch 604. As shown in FIG. 6A and FIG. 6C, bridge portions 606 connect between top active layer 106 of die region 602 and top active layer 106 of the remainder of the substrate outside of die region 602. In one example, bridge portions 606 each have a width w between about 20 μm and 300 μm, and a length L between about 200 μm and 3000 μm.

Figure 7C:
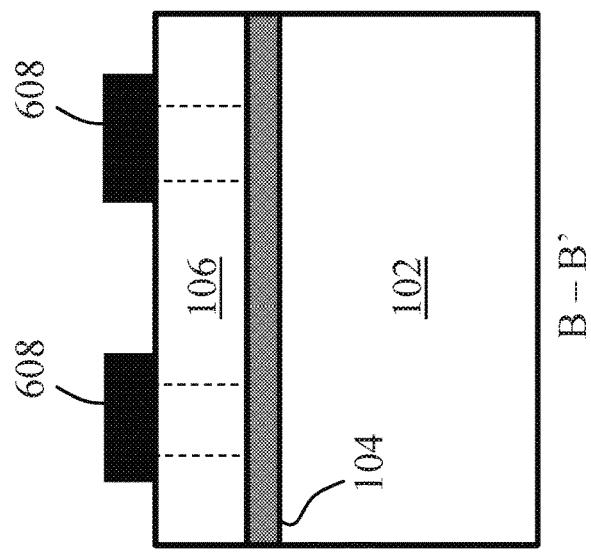
FIGS. 7A-7C illustrate different views of another step of the third fabrication procedure for a plurality of dice, according to an embodiment.
Figure 7B:
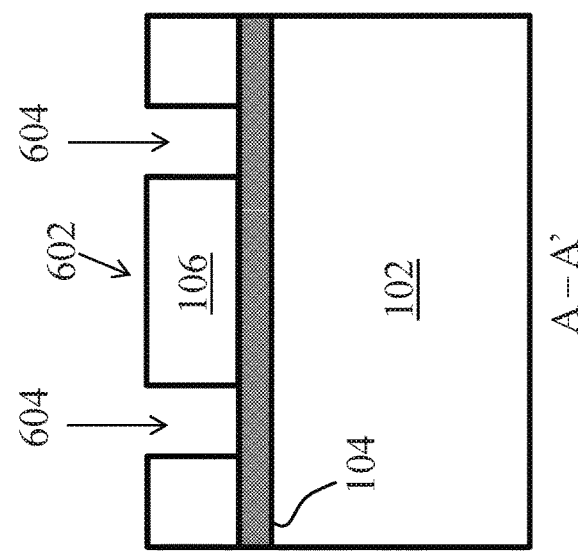
Figure 7A:
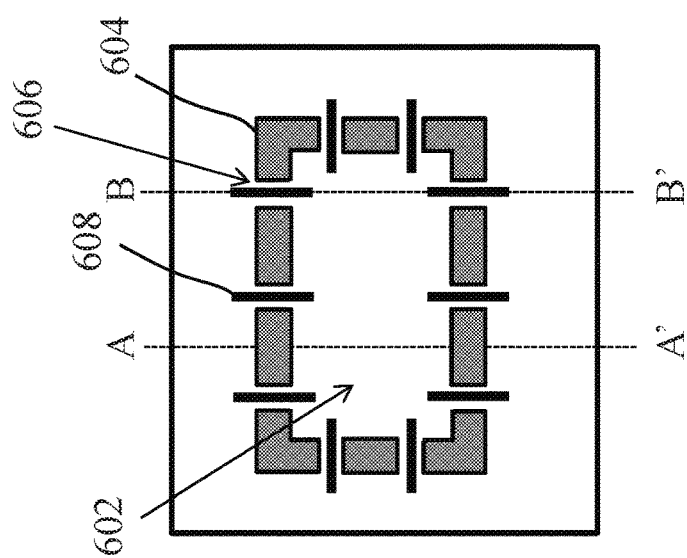

FIGS. 7A-7C illustrate three views of a second step of the third fabrication process, according to an embodiment. FIG. 7A provides a top-down view of the substrate. FIG. 7B provides a cross-section view along the A-A' line while FIG. 7C provides a cross-section view along the B-B' line.

FIGS. 7A and 7C illustrate the patterning of polymer material 608 over bridge portions 606, according to an embodiment. FIG. 7B illustrates the same cross-section as shown previously in FIG. 6B. Polymer material 608 may be patterned as strips running across bridge portions 606, and may have a greater length and a greater or lesser width than bridge portions 606. Any other patterns of polymer material 608 may be used so long as polymer material 608 traverses bridge portions 606. In an embodiment, various strips of polymer material 608 may connect together over portions of die region 602. In one example, polymer material 608 is polyimide. Other example polymer materials include poly (methyl methacrylate) (PMMA) and SU-8.

FIGS. 8A-8C illustrate three views of a third step of the third fabrication process, according to an embodiment. FIG. 8A provides a top-down view of the substrate. FIG. 8B provides a cross-section view along the A-A' line while FIG. 8C provides a cross-section view along the B-B' line.

A backside etch is performed on an opposite side of the substrate from the side that was etched with etch 604, according to an embodiment. The backside etch etches through bulk portion 102 and buried silicon oxide layer 104, according to an embodiment. In one example, the backside etch is patterned to only etch around a perimeter of die region 602 beneath portions etched by first etch 604 and bridge portions 606. As such, the backside etch forms through-holes 610 in the regions previously defined by etch 604 around a perimeter of die region 602, and deep trenches 612 beneath bridge portions 606. The backside etch may be aligned to the features on the opposite side of the substrate using an infrared camera.

After the backside etch has been performed, die region 602 is connected to the remainder of the substrate only via bridge portions 606 in top active layer 106 and polymer material 608. Thus, the presence of polymer material 608 helps to structurally reinforce the connection between die region 602 and the remainder of the substrate during the etching process. Once the etch has been completed, die region 602 may be partially or fully separated from the substrate by breaking along one or more bridge portions 606. This process may allow for the separation of die region 602 from the remainder of bulk portion 102 without any dicing or cleaving steps. After breaking the one or more bridge portions 606, die region 602 may have its edges polished to remove any irregularities caused by bridge portions 606. Additionally, portions of polymer material 608 may be present on die region 602 after it has been removed. These portions of polymer material 608 may be removed via a chemical etch or treatment by an oxygen plasma. In another embodiment, die region 602 remains connected via each of its bridge portions 606 to the substrate or to neighboring dies.

Figure 9C:
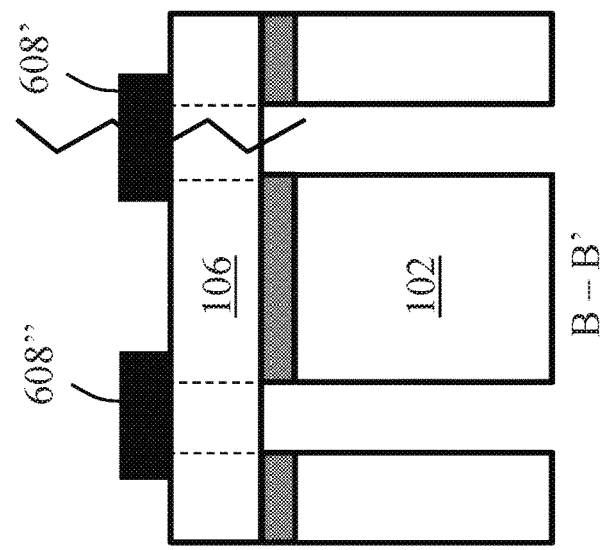
FIGS. 9A-9C illustrate different views of another step of the third fabrication procedure for a plurality of dice, according to an embodiment.
Figure 9B:
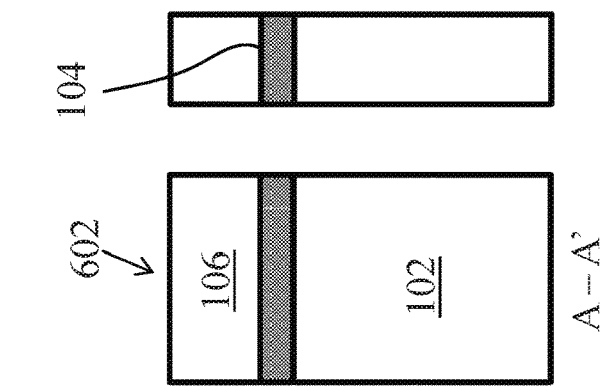
Figure 9A:
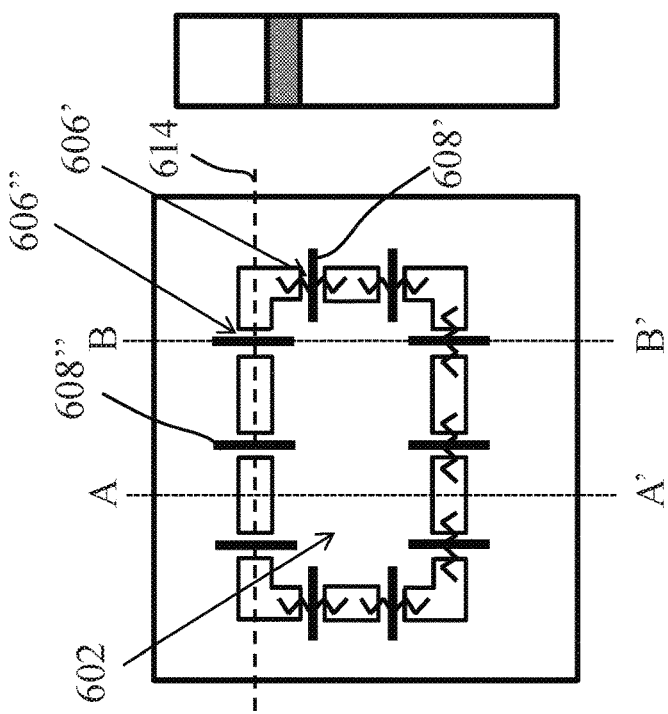

In one embodiment, die region 602 remains connected to the substrate or to one or more neighboring die regions by bridge portions 606 along one or more sides of die region 602. FIGS. 9A-9C illustrate three views of an optional fourth step of the third fabrication process, according to an embodiment. FIG. 9A provides a top-down view of the substrate. FIG. 9B provides a cross-section view along the A-A' line while FIG. 9C provides a cross-section view along the B-B' line. In this example, bridge portions 606' and polymer material 608' have been broken while bridge portions 606" and polymer material 608" remain intact. The zig-zag line patterns represent breaks through bridge portions 606' and polymer material 608'. Die region 602 may rotate about an axis 614 by remaining connected to the substrate via bridge portions 606" and polymer material 608". In another embodiment, die region 602 is connected to a neighboring die region via bridge portions 606" and polymer material 608".

Figure 10:
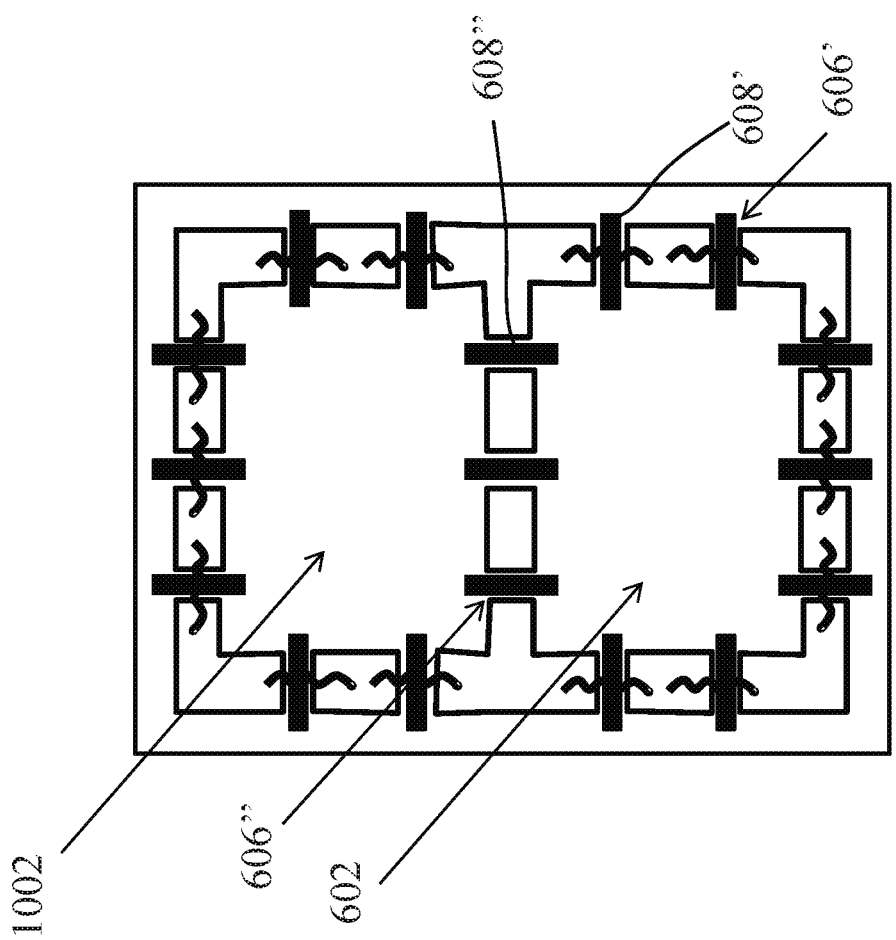
FIG. 10 illustrates another fabrication procedure for a plurality of dice, according to an embodiment.

FIG. 10 illustrates a top-down view of an example where die region 602 connects to a neighboring die region 1002 via bridge portions 606" and polymer material 608". The coupled die regions may be removed from the remainder of the substrate and remain attached together by bridge portions 606" and polymer material 608". It should be understood that any one or more sides of die region 602 may remain connected to neighboring die regions.

Figure 11:
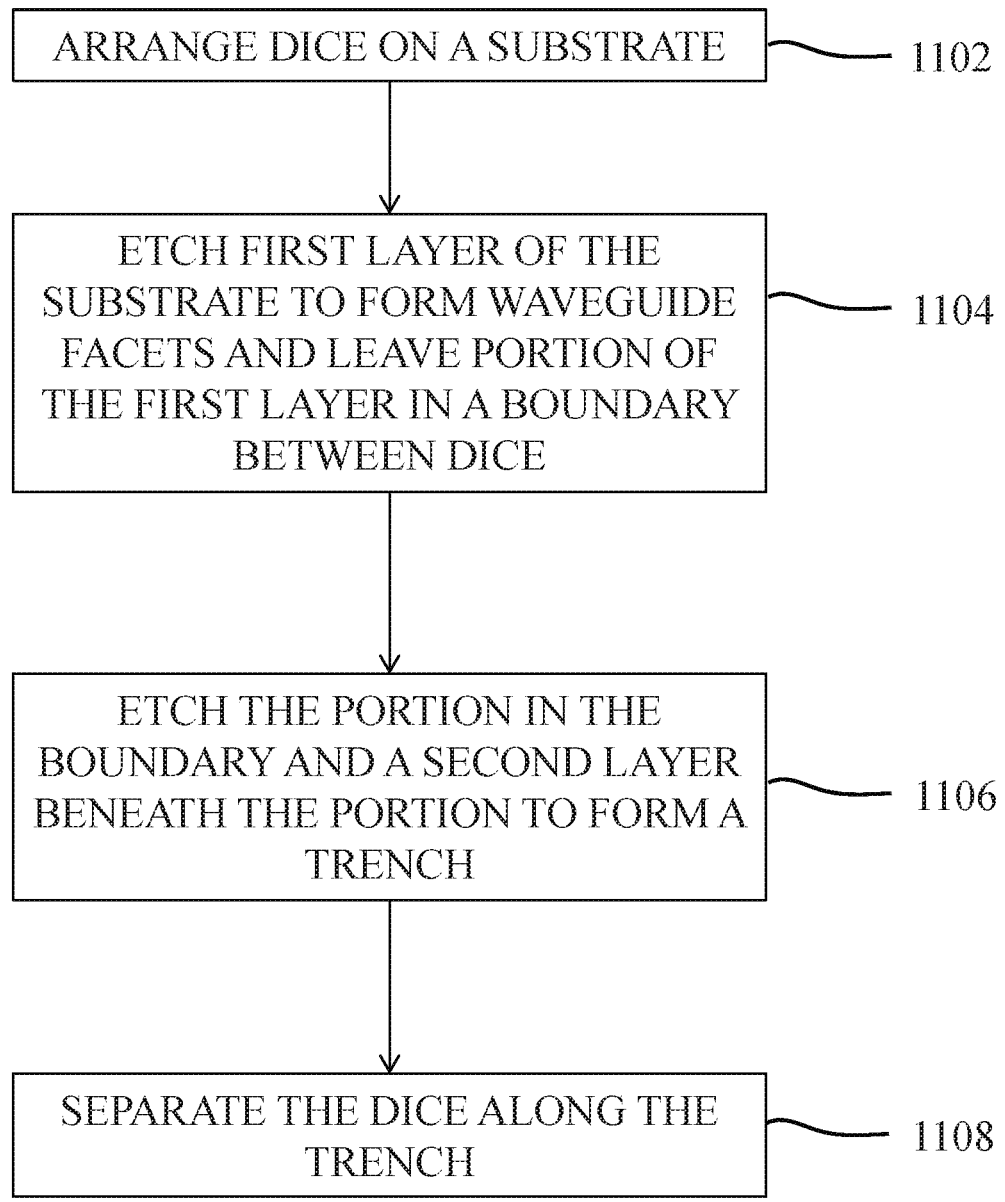
FIG. 11 illustrates a method of the first fabrication procedure, according to an embodiment.

FIG. 11 illustrates a flowchart of a first fabrication method 1100, according to an embodiment. Various steps of method 1100 have been illustrated in FIGS. 4A-4C, according to one example. It should be understood that other steps may occur between those illustrated here, but have been omitted for clarity and brevity. Such steps would involve conventional fabrication techniques that would be well understood by a person skilled in the art.

Method 1100 begins at step 1102, where dice are arranged on a substrate. The use of the term "arranged" in this context means that the dice are defined on the substrate in some pattern, such as a two-dimensional array. There may be space between adjacent dice, or each die may abut directly against a neighboring die. According to an embodiment, the substrate is a SOI substrate having a first layer (e.g., active layer), and a second layer (e.g., buried oxide layer) over a bulk portion of the substrate.

Method 1100 continues with step 1104, where the first layer of the substrate is etched to form at least waveguide facets, according to an embodiment. Step 1104 may represent a single etch step that also defines the waveguides on the substrate, such as when the waveguides are strip waveguides. In another example, step 1104 represents two different etch steps that also define the waveguides on the substrate, such as when the waveguides are rib waveguides. The various waveguide facets may be formed near an edge of each die at a boundary region between adjacent dice. The etching performed in step 1104 proceeds through a thickness of the first layer and stops at the second layer of the substrate.

During step 1104, a portion of the first layer is not etched and is left behind in the boundary region between adjacent dice on the substrate, according to an embodiment. The portion of the first layer left behind may represent a strip of the first layer that runs in the boundary region between adjacent dice.

Method 1100 continues with step 1106, where the portion of the first layer left in the boundary region and the second layer beneath the portion are etched to form a trench in the boundary region, according to an embodiment. The bulk portion of the substrate beneath the second layer may also be etched to form a deeper trench. A deep reactive ion etch (DRIE) process may be used, for example, to etch through a thickness of the portion of the first layer, a thickness of the second layer, and into the bulk portion of the substrate.

Method 1100 continues with step 1108, where the dice are separated from the substrate along the trench etched during step 1106, according to an embodiment. The dice may be separated by using a dicing saw or a laser cutting device to cut or scribe the substrate along the trench. In another example, the dice may be separated by cleaving the substrate along the trench. Because a portion of the first layer is left behind in step 1104, the etch performed in step 1104 does not etch any portion of the substrate where the separation occurs in step 1108.

Figure 12:
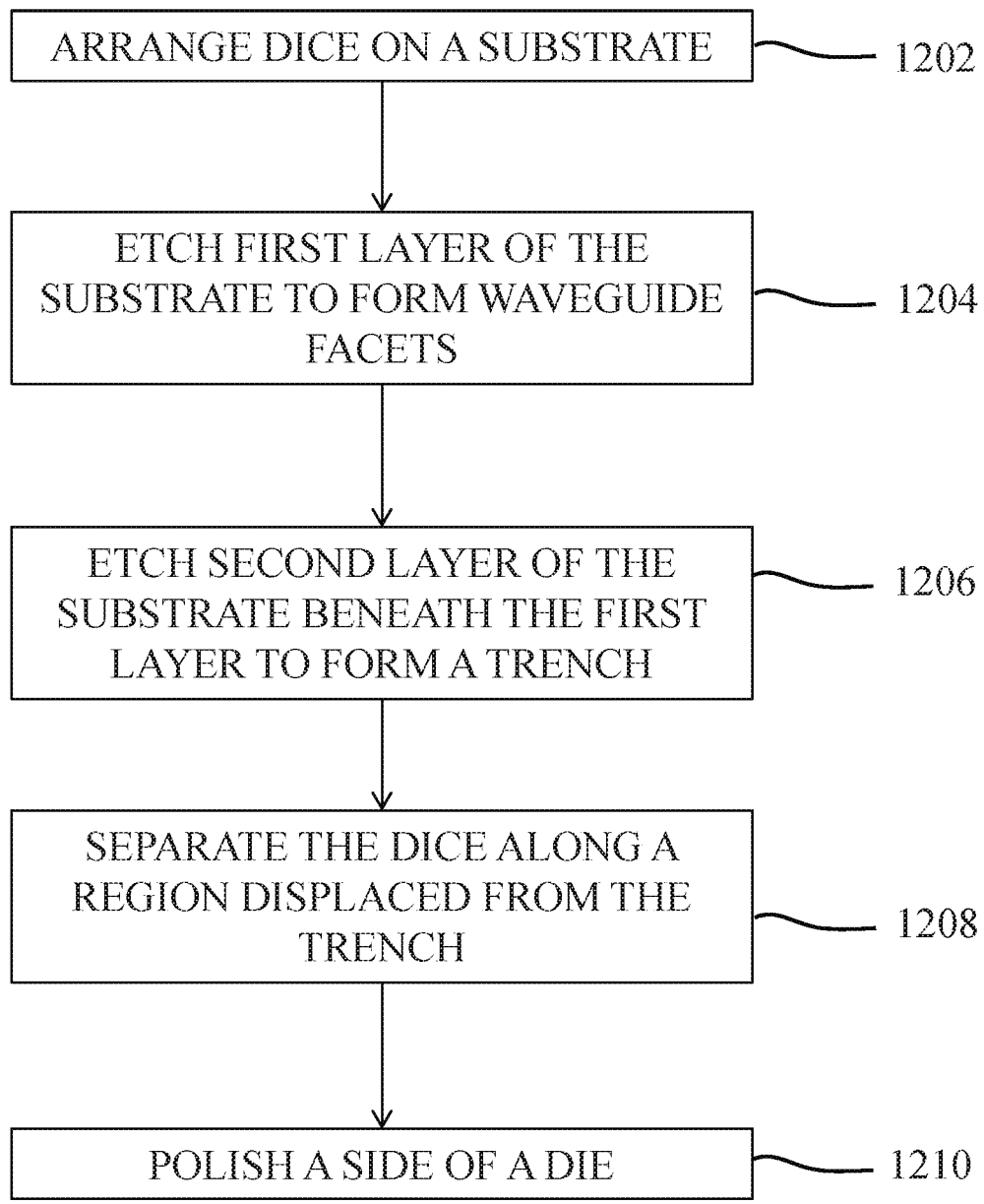
FIG. 12 illustrates a method of the second fabrication procedure, according to an embodiment.

FIG. 12 illustrates a flowchart of a second fabrication method 1200, according to an embodiment. Various steps of method 1200 have been illustrated in FIGS. 5A-5E, according to one example. It should be understood that other steps may occur between those illustrated here, but have been omitted for clarity and brevity. Such steps would involve conventional fabrication techniques that would be well understood by a person skilled in the art.

Method 1200 begins at step 1202, where dice are arranged on a substrate. The use of the term "arranged" in this context means that the dice are defined on the substrate in some pattern, such as a two-dimensional array. There may be space between adjacent dice, or each die may abut directly against a neighboring die. According to an embodiment, the substrate is a SOI substrate having a first layer (e.g., active layer), and a second layer (e.g., buried oxide layer) over a bulk portion of the substrate.

Method 1200 continues with step 1204, where the first layer of the substrate is etched to form at least waveguide facets, according to an embodiment. Step 1204 may represent a single etch step that also defines the waveguides on the substrate, such as when the waveguides are strip waveguides. In another example, step 1204 represents two different etch steps that also define the waveguides on the substrate, such as when the waveguides are rib waveguides. The various waveguide facets may be formed near an edge of each die at a boundary region between adjacent dice. The etching performed in step 1204 proceeds through a thickness of the first layer and stops at the second layer of the substrate.

Method 1200 continues with step 1206, where the second layer beneath the first layer is etched to form a trench in the boundary region, according to an embodiment. The bulk portion of the substrate beneath the second layer may also be etched to form a deeper trench. A deep reactive ion etch (DRIE) process may be used to etch through a thickness of the second layer and into the bulk portion of the substrate.

Method 1200 continues with step 1208, where the dice are separated from the substrate along a region that is displaced from the trench etched during step 1206, according to an embodiment. The dice may be separated by using a dicing saw or laser cutting device to cut or scribe the substrate along the region. The region may be located at a distance of at least 20 µm or at least 50 µm outside an edge of the trench. Thus, the separation of the dice does not occur at the region defined by either the etch performed in step 1204, or the etch performed in step 1206.

Method 1200 continues with step 1210, where a side of the die that has been separated from the substrate is polished back towards the trench, according to an embodiment, for example, until the trench is reached. A chemical mechanical polish (CMP) technique may be used to polish the side of the die, the process of which would be understood to a person skilled in the art.

Figure 13:
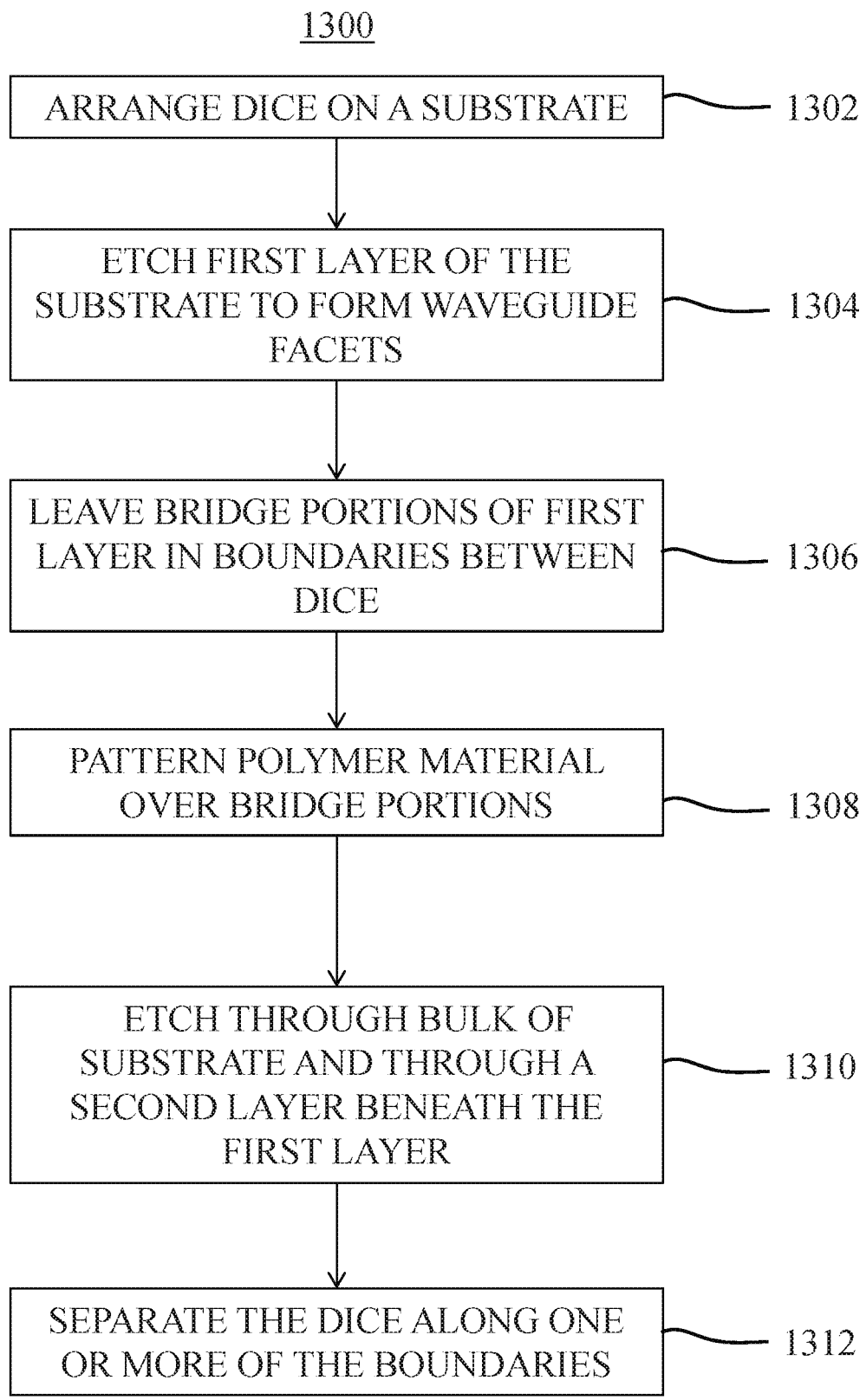
FIG. 13 illustrates a method of the third fabrication procedure, according to an embodiment.

FIG. 13 illustrates a flowchart of a third fabrication method 1300, according to an embodiment. Various steps of method 1300 have been illustrated in FIGS. 6A-6C, 7A-7C, and 8A-8C, according to one example. It should be understood that other steps may occur between those illustrated here, but have been omitted for clarity and brevity. Such steps would involve conventional fabrication techniques that would be well understood by a person skilled in the art.

Method 1300 begins at step 1302, where dice are arranged on a substrate. The use of the term "arranged" in this context means that the dice are defined on the substrate in some pattern, such as a two-dimensional array. There may be space between adjacent dice, or each die may abut directly against a neighboring die. According to an embodiment, the substrate is a SOI substrate having a first layer (e.g., active layer), and a second layer (e.g., buried oxide layer) over a bulk portion of the substrate.

Method 1300 continues with step 1304, where the first layer of the substrate is etched to form at least waveguide facets, according to an embodiment. Step 1304 may represent a single etch step that also defines the waveguides on the substrate, such as when the waveguides are strip waveguides. In another example, step 1304 represents two different etch steps that also define the waveguides on the substrate, such as when the waveguides are rib waveguides. The etching performed in step 1304 proceeds through a thickness of the first layer and stops at the second layer of the substrate.

Method 1300 continues with step 1306, where bridge portions of the first layer are left behind by the etching performed in step 1304. These bridge portions lie in boundary regions between a die region substantially defined by the etching process of step 1304 and a remainder of the substrate. Consequently, the bridge portions connect the die region to the remainder of the substrate through the first layer, according to an embodiment. It should be understood that step 1304 and step 1306 may occur simultaneously.

Method 1300 continues with step 1308, where polymer material is patterned over the bridge portions. The polymer material may be polyimide and may be patterned such that a strip of the polymer material spans across at least the full length of its corresponding bridge portion.

Method 1300 continues with step 1310, where a backside substrate etch is performed to etch through the bulk portion of the substrate and through the second layer of the substrate. The backside etch is performed on an opposite side of the substrate from the side that was etched in step 1304. In one example, the backside etch only etches the substrate around a perimeter of the die region beneath at least some of the portions etched during step 1304 and beneath the bridge portions left behind in the first layer. After the backside etch has been performed, the die region is connected to the remainder of the substrate only by the bridge portions in the first layer and by the polymer strips.

Method 1300 may continue with an optional step 1312, where the die region is separated from the remainder of the substrate by breaking the substrate along the bridge portions in one or more of the boundary regions around the die as illustrated, for example, in FIGS. 9A-9C. Due to the brittle nature of the thin bridge portions, relatively minimal force should be required to break the bridge portions. Laser cutting may also be used to separate the die region by cutting through the bridge portions.

After separation, the edges of the die may be polished to remove any portions of the bridge portions and/or the polymer strips that remain behind. In an example where the die is completely separated from the substrate, any portions of the polymer material that remain behind may also be removed by chemical etching or applying an oxygen plasma.

CLOSING REMARKS

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method, comprising:
    arranging a plurality of dice on a substrate;
    performing a first etching process that etches a first layer of the substrate at a boundary between adjacent dice of the plurality of dice on the substrate, wherein the first etching process forms facets of one or more waveguides that are defined within the first layer, and wherein the first etching process leaves a portion of the first layer in the boundary between the adjacent dice;
    performing a second etching process that etches the portion of the first layer and a second layer beneath the portion of the first layer, the second etching process forming a trench in the boundary, wherein the second layer has a different material from the first layer; and
    separating the plurality of dice into individually separated dice along the trench.

2. The method of claim 1, wherein the substrate is a silicon-on-insulator (SOI) substrate.

3. The method of claim 2, wherein a first thickness of the first layer is between 3 micrometers and 10 micrometers, and a second thickness of the second layer is between 300 nanometers and 3 micrometers.

4. The method of claim 2, wherein a first thickness of the first layer is between 100 nanometers and 1 micrometer.

5. The method of claim 1, wherein the first etching process etches through a first thickness of the first layer and substantially stops at the second layer.

6. The method of claim 1, wherein the second etching process etches through a second thickness of the second layer and into a bulk portion of the substrate.

7. The method of claim 6, wherein the second etching process etches to a depth of between 50 micrometers and 150 micrometers into the bulk portion of the substrate.

8. The method of claim 1, wherein the separating of the plurality of dice comprises dicing along the trench using a dicing saw or using a laser.

* * * * *